(12) United States Patent
Wu et al.

(10) Patent No.: US 12,387,971 B2
(45) Date of Patent: Aug. 12, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Runping Wu, Hefei (CN); Taegyun Kim, Hefei (CN); Daejoong Won, Hefei (CN); Soonbyung Park, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 701 days.

(21) Appl. No.: 17/841,668

(22) Filed: Jun. 16, 2022

(65) Prior Publication Data
US 2023/0317507 A1 Oct. 5, 2023

Related U.S. Application Data

(63) Continuation of application No. PCT/CN2022/086486, filed on Apr. 13, 2022.

(30) Foreign Application Priority Data

Mar. 29, 2022 (CN) .......................... 202210320417.0

(51) Int. Cl.
| | | |
|---|---|---|
| *H01L 21/768* | (2006.01) | |
| *H01L 21/32* | (2006.01) | |
| *H01L 21/762* | (2006.01) | |

(52) U.S. Cl.
CPC ........ *H01L 21/76205* (2013.01); *H01L 21/32* (2013.01); *H01L 21/76224* (2013.01)

(58) Field of Classification Search
CPC ............... H01L 21/76205; H01L 21/32; H01L 21/76224; H10B 12/315; H10B 12/09; H10B 12/482; H10B 12/485
See application file for complete search history.

(56) References Cited

U.S. PATENT DOCUMENTS

| | | | |
|---|---|---|---|
| 7,026,628 B2 | 4/2006 | Krueger | |
| 2018/0350817 A1* | 12/2018 | Wang | ................... H10B 12/482 |

(Continued)

FOREIGN PATENT DOCUMENTS

| | | |
|---|---|---|
| CN | 104900584 A | 9/2015 |
| CN | 106504985 A | 3/2017 |

(Continued)

OTHER PUBLICATIONS

ISA State Intellectual Property Office of the People's Republic of China, International Search Report Issued in Application No. PCT/CN2022/086486, 03 Jan. 3, 2023, WIPO, 10 pages.

*Primary Examiner* — Samuel Park
(74) *Attorney, Agent, or Firm* — Kilpatrick Townsend & Stockton LLP

(57) ABSTRACT

Embodiment relates to a semiconductor structure and a fabrication method thereof. The method for fabricating a semiconductor structure includes: providing a substrate including an array region and a peripheral region connected to the array region; arranging a plurality of pads on the array region, an isolation trench being formed between adjacent two of the plurality of pads; and forming a to-be-etched path layer on a sidewall of the isolation trench. In the method for fabricating a semiconductor structure, after the plurality of pads are formed, a to-be-etched path layer is formed on a sidewall of the isolation trench between the plurality of pads. The to-be-etched path layer may be in contact with a to-be-etched material layer in the array region. After a flat surface is formed on the array region and the peripheral region, the to-be-etched path layer and the to-be-etched material layer may be removed in sequence.

16 Claims, 3 Drawing Sheets

(56) References Cited

U.S. PATENT DOCUMENTS

2020/0020697 A1     1/2020  Kim et al.
2021/0134804 A1*    5/2021  Jung ................ H01L 21/76897

FOREIGN PATENT DOCUMENTS

| CN | 110098175 A | 8/2019 |
| CN | 113675145 A | 11/2021 |
| CN | 113690219 A | 11/2021 |
| CN | 113937059 A | 1/2022 |

* cited by examiner

SEMICONDUCTOR STRUCTURE AND FABRICATION METHOD THEREOF

CROSS-REFERENCE TO RELATED APPLICATION

The present disclosure is a continuation of PCT/CN2020/086486, filed on Apr. 13, 2022, which claims priority to Chinese Patent Application No. 202210320417.0 filed to the State Patent Intellectual Property Office on Mar. 29, 2022, the entire contents of which are incorporated herein by reference into the present disclosure.

TECHNICAL FIELD

The present disclosure relates to the field of semiconductor manufacturing technology, and more particularly, to a semiconductor structure and a fabrication method thereof.

BACKGROUND

With the improvement of integration of semiconductor devices, a distance between adjacent conductive structures decreases, resulting in an increase in parasitic capacitance between the conductive structures, thereby causing performance deterioration of the semiconductor devices.

The parasitic capacitance may be reduced by forming air sidewalls on two sides of each of bit line structures. However, in traditional fabrication processes of the air sidewalls, it is easy to cause an adverse effect on regions other than array regions, i.e., a dielectric layer that should not be removed is hollowed out such that electronic devices in the dielectric layer are exposed, which has an adverse effect on product performance.

SUMMARY

According to various embodiments of the present disclosure, a semiconductor structure and a fabrication method thereof are provided.

According to some embodiments, a first aspect of the present disclosure provides a method for fabricating a semiconductor structure. The method includes: providing a substrate, which includes an array region and a peripheral region connected to the array region; arranging a plurality of pads on the array region, an isolation trench being formed between adjacent two of the plurality of pads; and forming a to-be-etched path layer on a sidewall of the isolation trench.

In the method for fabricating a semiconductor structure, after the plurality of pads are formed, a to-be-etched path layer is formed on a sidewall of the isolation trench between the plurality of pads. The to-be-etched path layer may be in contact with a to-be-etched material layer in the array region. After a flat surface is formed on the array region and the peripheral region, the to-be-etched path layer and the to-be-etched material layer may be removed in sequence. Because the peripheral region has a flat surface, a high-quality protective material layer may be formed on the surface of the peripheral region to prevent devices or material layers in the peripheral region from being damaged, thereby increasing product yield.

Details of one or more embodiments of the present disclosure are set forth in the following drawings and descriptions. Other features, objectives, and advantages of the present disclosure will become apparent from the description, the drawings, and the claims.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
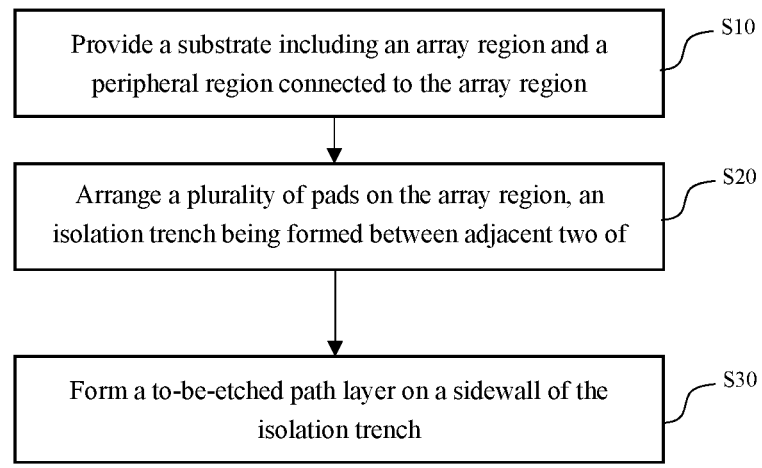
FIG. 1 is a flow block diagram of a method for fabricating a semiconductor structure according to an embodiment of the present disclosure.

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that disclosed contents of the present disclosure are understood more thoroughly and completely.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

When describing a positional relationship, unless otherwise specified, when an element such as a layer or base substrate is referred to as being "on" another film layer, it may be directly on the other film layer or an intervening film layer may also be present. Further, when a layer is referred to as being "under" another layer, it may be directly under the other layer, or one or more intervening layers may also be present. It is also to be understood that when a layer is referred to as being "between" two layers, it may be the only one between the two layers, or one or more intervening layers may also be present.

In the case of "comprising", "having", and "including" as described herein, another component may also be added unless a clearly defined term is used, such as "only", "consisting of", etc. Unless mentioned to the contrary, terms in the singular form may include the plural form and cannot be understood as one in number.

In the description of the present disclosure, it is to be noted that unless specified or limited otherwise, terms "connecting" or "connection" should be understood in a broad sense, which may be, for example, a fixed connection, a detachable connection or integrated connection, a direct connection or an indirect connection by means of an intermediary, or internal communication between two components. For those of ordinary skill in the art, concrete meanings of the above terms in the present disclosure may be understood based on concrete circumstances.

In addition, in the description of the present disclosure, unless otherwise specified, "a plurality of", "mutually", "superimposed", "stacked" and "multiple" mean two or more.

With the improvement of integration of semiconductor devices, a distance between adjacent conductive structures decreases, resulting in an increase in parasitic capacitance between the conductive structures, thereby causing performance deterioration of the semiconductor devices. The parasitic capacitance may be reduced by forming air sidewalls between adjacent conductive structures. For example, the parasitic capacitance between bit lines and node contact structures can be reduced by forming the air sidewalls on two sides of each of bit line structures.

However, in traditional fabrication processes of bit line air sidewalls, because of a close distance between an array region and a peripheral region connected to the array region, when the air sidewalls are formed in the array region by means of an etching process, grooves may be formed on a surface of the peripheral region, which may destroy a silicon nitride layer above a silicon oxide layer, such that the silicon oxide layer in the peripheral region is hollowed out, and electronic devices in the silicon oxide layer are exposed, causing serious hidden dangers to reliability of products.

An existing solution is as below. After pads are formed, a thickness of the silicon nitride layer deposited on the surface of the array region and the peripheral region is increased. That is, it is expected to enhance protection of the peripheral region by increasing the thickness of the silicon nitride layer. However, because the thickness of the silicon nitride layer in the array region is also increasing, it is difficult to provide an opening above a bit line sidewall structure, leading to failure of formation of the air sidewalls.

Therefore, it is necessary to provide a semiconductor structure and a fabrication method thereof in view of the problems existing in the above technical solutions, such that in the process of fabricating the air sidewalls, the air sidewalls can be successfully formed, and regions other than the array region can be protected from being damaged, thereby improving product yield.

As shown in FIG. 1, an embodiment of the present disclosure discloses a method for fabricating a semiconductor structure, including:
S10: providing a substrate, which includes an array region and a peripheral region connected to the array region;
S20: arranging a plurality of pads on the array region, an isolation trench being formed between adjacent two of the plurality of pads; and
S30: forming a to-be-etched path layer on a sidewall of the isolation trench.

In the method for fabricating a semiconductor structure, after the plurality of pads are formed, a to-be-etched path layer is formed on a sidewall of the isolation trench between the plurality of pads. The to-be-etched path layer may be in contact with a to-be-etched material layer in the array region. After a flat surface is formed on the array region and the peripheral region, the to-be-etched path layer may be removed to expose the to-be-etched material layer. Because the peripheral region has a flat surface, a high-quality protective material layer may be formed on the surface of the peripheral region to prevent devices or material layers in the peripheral region from being damaged, thereby increasing product yield.

For example, a substrate 10 provided in Step S10 includes an array region 11 and a peripheral region 12 connected to the array region 11. The array region 11 includes active regions 111 arranged in an array and shallow trench isolation (STI) structures 112 configured to separate the active regions 111. The peripheral region is provided with a substrate and a buffer layer 121 and a protective layer 122 arranged on the substrate. The buffer layer 121 may include, but is not limited to, a silicon oxide layer; and the protective layer 122 may include, but is not limited to, a silicon nitride layer.

In some embodiments, the array region 11 is provided with bit line structures 20 arranged in parallel at intervals and multiple node contact structures 30 positioned between the bit line structures 20, where the plurality of pads are formed on the multiple node contact structures 30 in one-to-one correspondence.

Figure 2:
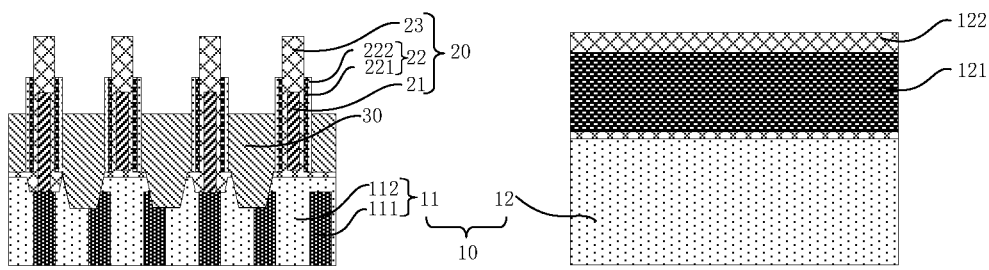
FIG. 2 is a schematic cross-sectional structural diagram showing an array region and a peripheral region of the semiconductor structure according to an embodiment of the present disclosure.

For example, as shown in FIG. 2, each of the bit line structures 20 includes a bit line 21 and a sidewall structure 22 positioned on two opposite sides of the bit line 21. In some embodiments, the bit line 21 includes a polysilicon layer, a barrier metal layer and a metal conductor layer stacked in sequence from bottom to top. In some other embodiments, the bit line 21 includes a metal conductor layer and a barrier metal layer wrapping a bottom surface and side surfaces of the metal conductor layer. The metal conductor layer may be a metal layer with lower resistivity, such as phosphorus (P) or arsenic (As) doped germanium (Ge), tungsten (W), copper (Cu) or gold (Au); and the barrier metal layer may be, for example, a titanium layer or titanium nitride layer. As shown in FIG. 2, each of the bit line structures 20 includes a first portion and a second portion, where the first portion is electrically connected to each of the active regions 111, and the second portion is positioned above each of the STI structures 112. Each of the multiple node contact structures 30 is positioned between adjacent two of the bit line structures 20, penetrates through an upper surface of the array region 11, and is electrically connected to each of the active regions 111 positioned below the multiple node contact structures 30. The multiple node contact structures 30 may be material layers with better conductivity, such as polysilicon layers or metal layers.

The sidewall structure 22 includes a first dielectric layer 221 and a second dielectric layer 222 positioned on an outside of the first dielectric layer 221. The first dielectric layer 221 is positioned on two opposite sides of the bit line 21, and the second dielectric layer 222 is positioned on the outside of the first dielectric layer 221. In some embodiments, the second dielectric layer 222 wraps around the first dielectric layer 221. That is, the second dielectric layer 222 covers sidewalls and a top of the first dielectric layer 221. For example, the first dielectric layer 221 may be a silicon dioxide layer, and the second dielectric layer 222 may be an insulating layer with higher hardness, such as a silicon nitride layer.

For example, each of the bit line structures 20 also includes a bit line dielectric layer 23 positioned on an upper surface of the bit line 21, where the bit line dielectric layer 23 includes a first sidewall and second sidewall opposite to each other. For example, the bit line dielectric layer 23 may include, but is not limited to, a silicon nitride layer.

With continued reference to FIG. 2, the peripheral region 12 is provided with a buffer layer 121 and a protective layer 122 positioned on a surface of the buffer layer 121. The buffer layer 121 may be, for example, a silicon oxide layer; and the protective layer 122 may be, for example, a silicon nitride layer.

Figure 3:
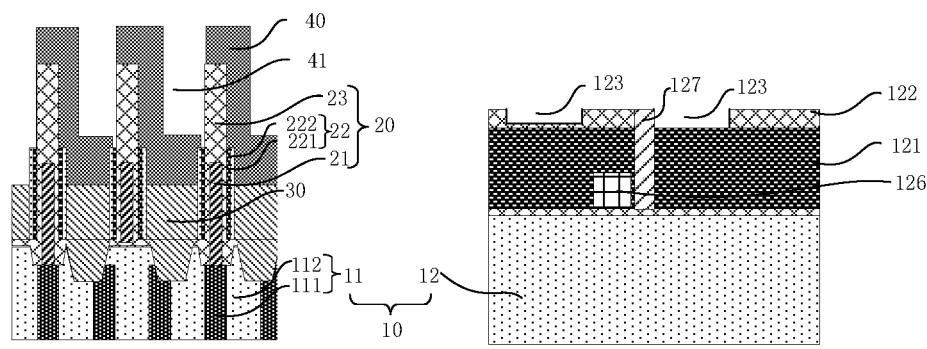
FIG. 3 is a schematic cross-sectional structural diagram showing the semiconductor structure after a plurality of pads are formed thereon according to an embodiment of the present disclosure.

In Step S20, as shown in FIG. 3, a plurality of pads 40 are arranged on the array region 11, and an isolation trench 41 is formed between adjacent two of the plurality of pads 40.

For example, as shown in FIG. 3, each of the plurality of pads 40 is connected to each of the multiple node contact structures 30 and covers a top surface and the first sidewall of the bit line dielectric layer 23. An isolation trench 41 is formed between adjacent two of the plurality of pads 40, and the isolation trench 41 exposes the second sidewall of the bit line dielectric layer 23 and the sidewall structure 22 close to the second sidewall. For example, the isolation trench 41 exposes a top surface of the first dielectric layer 221. In some embodiments, the step of forming a plurality of pads 40 and an isolation trench 41 on each of the multiple node contact structures 30 includes:

S21: forming a metal material layer on the array region 11, the metal material layer covering each of the bit line structures 20 and each of the multiple node contact structures 30.

For example, the metal material layer may include a metal layer with lower resistivity, such as a copper layer, a titanium layer, and other metal layers. As an example, the copper layer may be formed above the array region 11 by means of an electroless copper plating process. After the metal material layer is formed, an upper surface of the metal material layer may be polished to be flat by means of a chemical mechanical polishing (CMP) process.

S22: Etching the metal material layer to form a plurality of mutually independent pads 40, during this process, grooves 123 being formed on the surface of the peripheral region 12.

For example, a patterned photoresist layer may be formed on the upper surface of the metal material layer, and patterns in the patterned photoresist layer define positions and sizes of the plurality of pads 40. Next, the metal material layer is etched based on the patterned photoresist layer by means of an etching process, and the plurality of pads 40 is formed on the multiple node contact structures 30, as shown in FIG. 3. For example, when the metal material layer is etched, an isolation trench 41 may be formed between adjacent two of the plurality of pads 40. The isolation trench 41 exposes the second sidewall of the bit line dielectric layer 23 and the sidewall structure 22 close to the second sidewall. In some embodiments, the second dielectric layer 222 in the sidewall structure wraps around the first dielectric layer 221. Therefore, the second dielectric layer 222 needs to be etched to expose the top of the first dielectric layer 221.

For example, both the second dielectric layer 222 and the protective layer 12 of the peripheral region 12 are silicon nitride layers. During the process of etching the second dielectric layer 222 to expose the first dielectric layer 221, the protective layer above the peripheral region 12 is apt to be damaged to form the grooves 123, as shown in FIG. 3. Part of the grooves 123 penetrate through the protective layer 122 to expose the buffer layer 121; and part of the grooves 123 are positioned in the protective layer 122, such that a thickness of the protective layer 122 at this position is reduced and thus a protective effect is weakened.

In some embodiments, as shown in FIG. 3, an electronic device 126 such as a transistor may be formed in the buffer layer 121. A metal plug 127 penetrating through the protective layer 122 and the buffer layer 121 is formed in the peripheral region 12. Because the protective layer 122 on the peripheral region 12 is damaged, it is difficult to protect the buffer layer 121 well. If the air sidewalls are fabricated in the sidewall structure 22 still using the traditional processes, the buffer layer 121 may likely be hollowed out, such that the electronic device 126 in the buffer layer 121 or a sidewall of the metal plugs 127 is exposed, which will seriously have a negative effect on device performance.

Figure 4:
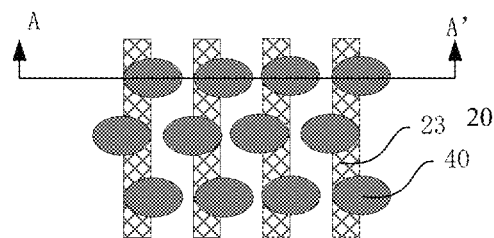
FIG. 4 is a vertical view of the array region of the structure as shown in FIG. 3.

After the plurality of pads 40 are formed, a vertical view of the array region 11 is as shown in FIG. 4. The part of the array region 11 in FIG. 3 is a schematic cross-sectional structural diagram taken along an AA' direction in FIG. 4. Exemplarily, the sidewall structure 22 includes a first sidewall structure and a second sidewall structure, which are positioned on two opposite sides of the bit line 21 respectively. The first sidewall structure is close to the first sidewall of the bit line dielectric layer 23, and the second sidewall structure is close to the second sidewall of the bit line dielectric layer 23. As can be known according to FIG. 4, for the same bit line structure 20, a part of the plurality of pads 40 cover the top surface and the first sidewall of the bit line dielectric layer 23, and the isolation trench 41 exposes the second sidewall and the first dielectric layer 221 in the second sidewall structure. Another part of the plurality of pads 40 cover the top surface and the second sidewall of the bit line dielectric layer 23, and the isolation trench 41 exposes the first sidewall and the first dielectric layer 221 in the first sidewall structure. The plurality of pads 40 are arranged crosswise between the bit lines 20. One side of the plurality of pads 40 is connected to this group of bit lines 20, and a gap is provided between the other side of the plurality of pads 40 and an adjacent group of bit lines 20, which can allow an etching gas to successfully pass.

Figure 5:
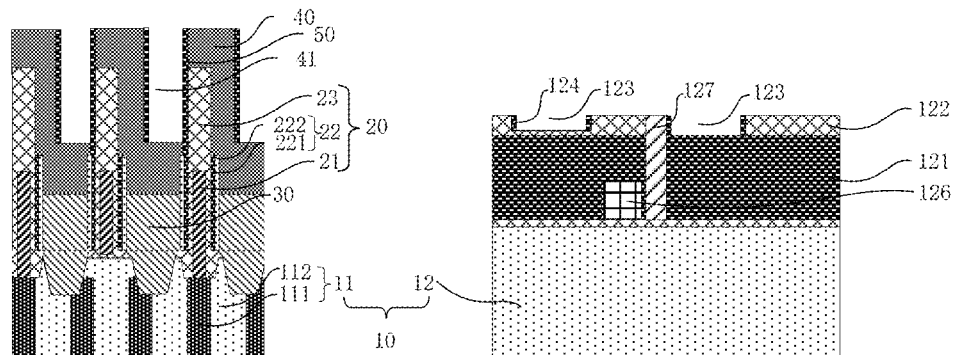
FIG. 5 is a schematic cross-sectional structural diagram showing the semiconductor structure after a to-be-etched path layer is formed thereon according to an embodiment of the present disclosure.

In Step S30, as shown in FIG. 5, a to-be-etched path layer 50 is formed on a sidewall of the isolation trench 41.

For example, the to-be-etched path layer 50 and the first dielectric layer 221 are made from the same material. For example, they are both silicon oxide layers. For example, the isolation trench 41 may be filled with a silicon oxide layer first, and then the silicon oxide layer is etched back, only a certain thickness of the silicon oxide layer being retained on a sidewall of the isolation trench 41 to serve as the to-be-etched path layer 50. The process of forming the silicon oxide layer may include a chemical vapor deposition (CVD) process, an atomic layer deposition (ALD) process, a plasma vapor deposition (PVD) process, an in-situ steam generation (ISSG) process or a rapid thermal oxidation (RTO) process.

As can be known reference to FIG. 4, for the same bit line structure 20, a part of the plurality of pads 40 cover the top surface and the first sidewall of the bit line dielectric layer 23, and the isolation trench 41 exposes the second sidewall and the first dielectric layer 221 in the second sidewall structure. Therefore, the to-be-etched path layer 50 positioned on the sidewall of the isolation trench 41 may be connected to the first dielectric layer 221 in the second sidewall structure. Another part of the plurality of pads 40 cover the top surface and the second sidewall of the bit line dielectric layer 23, the isolation trench 41 exposes the first sidewall and the first dielectric layer 221 in the first sidewall structure. Therefore, the to-be-etched path layer 50 positioned on the sidewall of the isolation trench 41 may be connected to the first dielectric layer 221 in the first sidewall structure.

For example, a peripheral region dielectric layer 124 is formed on a sidewall of the groove 123 while forming the to-be-etched path layer 50, where the peripheral region dielectric layer 124 and the to-be-etched path layer 50 are made from the same material, for example, both the peripheral region dielectric layer 124 and the to-be-etched path layer 50 are silicon oxide layers.

As shown in FIG. 5, a top surface of the to-be-etched path layer 50 is flush with an upper surface of each of the plurality of pads 40, and a top surface of the peripheral region dielectric layer 124 is flush with an upper surface of the protective layer 122. In some embodiments, multiple metal electrode layers are formed on the upper surface of the protective layer 122, the groove 123 is positioned between adjacent two of the multiple metal electrode layers, and the top surface of the peripheral region dielectric layer 124 is flush with upper surfaces of the multiple metal electrode layers. For example, the metal electrode layer is electrically connected to the metal plug 127.

In the method for fabricating a semiconductor structure, after the plurality of pads are formed, a to-be-etched path layer is formed on a sidewall of the isolation trench between the plurality of pads. The to-be-etched path layer may be connected to a to-be-etched material layer (for example, a first dielectric layer) in the array region. After a flat surface is formed on the array region and the peripheral region, the to-be-etched path layer and the first dielectric layer may be removed in sequence to form an air sidewall. Because the peripheral region has a flat surface, a high-quality protective material layer may be formed on the surface of the peripheral region to prevent devices or material layers in the peripheral region from being damaged, thereby increasing product yield.

In some embodiments, after forming the to-be-etched path layer 50, the method for fabricating a semiconductor structure also includes:

S40: forming a filling layer filling up the isolation trench;
S50: forming a hard mask layer covering an upper surface of the peripheral region and exposing an upper surface of the array region;
S60: removing the to-be-etched path layer and the first dielectric layer to form an air sidewall in the sidewall structure; and
S70: forming a sealing layer on the upper surface of the array region to seal up an opening above the air sidewall.

Figure 6:
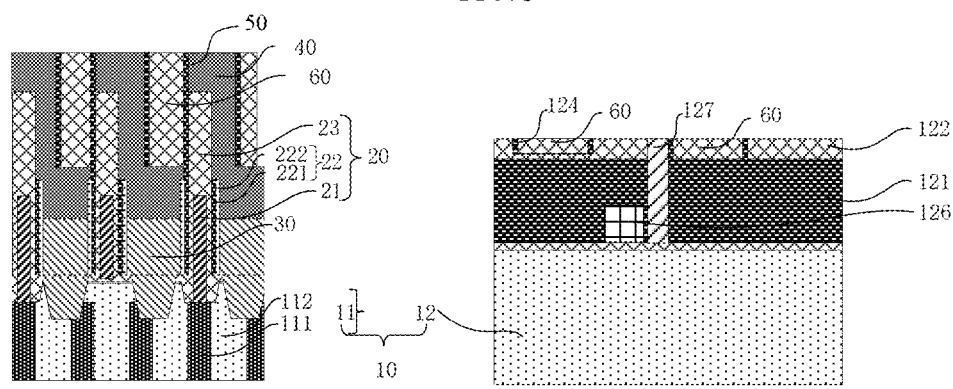
FIG. 6 is a schematic cross-sectional structural diagram showing the semiconductor structure after a filling layer is formed thereon according to an embodiment of the present disclosure.

In Step S40, as shown in FIG. 6, a filling layer 60 is formed, where the filling layer 60 fills up the isolation trench 41 and the groove 123. In some embodiments, the step of forming the filling layer 60 includes:

S41: forming a filling material layer covering an upper surface of a structure obtained and filling up the isolation trench 41 and the groove 123.

For example, the filling material layer may include, but is not limited to, a silicon nitride layer. The silicon nitride layer may be deposited on the upper surface of the structure obtained by means of the ALD process or the CVD process, where the silicon nitride layer fills up the isolation trench 41 and the groove 123.

S42: removing the filling material layer on the upper surface of the structure obtained to form the filling layer 60.

For example, the filling material layer on the upper surface of the structure obtained may be removed by means of the CMP process until the to-be-etched path layer 50 and the upper surfaces of the plurality of pads 40 are exposed, thereby obtaining the filling layer 60. In some embodiments, after the surface of the peripheral region 12 is polished, the upper surface of the peripheral region dielectric layer 124 and the upper surface of the metal electrode layer are exposed. The upper surface of the filling layer 60 is flush with the top surface of the to-be-etched path layer 50 and the top surface of the peripheral region dielectric layer 124. The filling layer 60 fills up the groove 123 and the isolation trench 41 to form a flat surface above the array region 11 and the peripheral region 12, which is advantageous to forming a high-quality hard mask layer in subsequent process steps.

In other embodiments, the filling material layer may also be etched back by means of an etching process to remove the filling material layer other than the isolation trench 41 and the groove 123 until the top surface of the to-be-etched path layer 50 is exposed, and a flat surface is formed above the array region 11 and the peripheral region 12.

Figure 7:
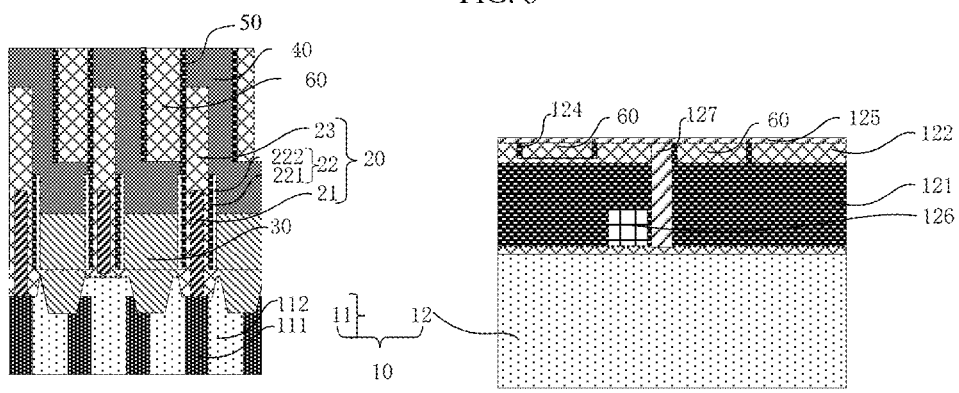
FIG. 7 is a schematic cross-sectional structural diagram showing the semiconductor structure after a hard mask layer is formed thereon according to an embodiment of the present disclosure.

In Step S50, as shown in FIG. 7, a hard mask layer 125 is formed, where the hard mask layer 125 covers the upper surface of the peripheral region 12 and exposes the upper surface of the array region 11. The Step S50 includes:

S51: forming a hard mask material layer on the substrate 10.

For example, the hard mask material layer may include, but is not limited to, a silicon nitride layer or a silicon oxynitride layer. The hard mask material layer may be formed on the upper surface of the substrate 10 by means of the CVD process or the ALD process. The hard mask material layer covers the upper surface of the array region 11 and the upper surface of the peripheral region 12. The upper surface of the array region 11 and the upper surface of the peripheral region 12 have flat surfaces after the chemical mechanical polishing. Therefore, a high-quality flat hard mask material layer may be formed on the upper surface of the array region 11 and the upper surface of the peripheral region 12.

S52: removing the hard mask material layer on the upper surface of the array region 11 to expose the top surface of the to-be-etched path layer 50, and retaining the hard mask material layer on the upper surface of the peripheral region 12 to form the hard mask layer 125.

For example, the hard mask material layer on the array region 11 may be etched and removed by means of a trim etch process to expose the upper surface of the to-be-etched path layer 50, while the hard mask material layer on the peripheral region 12 is retained to obtain the hard mask layer 125, as shown in FIG. 7. The hard mask layer 125 is positioned above the filling layer 60, the peripheral region dielectric layer 124, the metal plug 127 and the protective layer 122, and can prevent the etching process from causing damage to the buffer layer 121 in the peripheral region 12 during the formation of the air sidewall. Because the upper surface of the peripheral region 12 is a flat surface, the hard mask layer 125 formed thereon is less apt to have holes or uneven thickness, which can protect the peripheral region 12 well.

Figure 8:
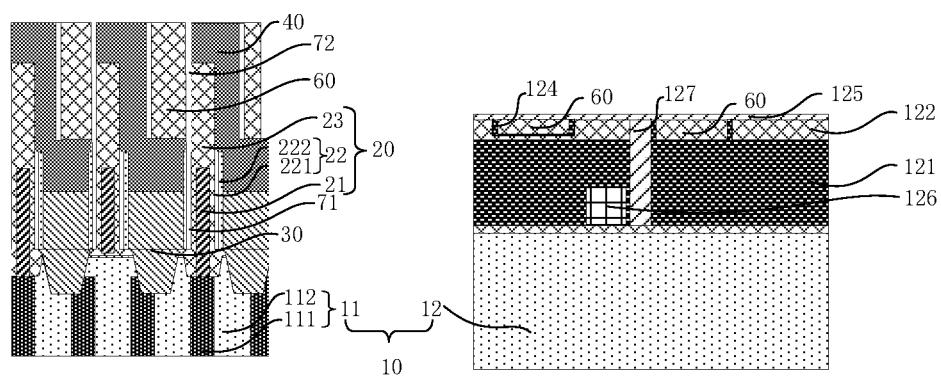
FIG. 8 is a schematic cross-sectional structural diagram showing the semiconductor structure after an air sidewall is formed thereon according to an embodiment of the present disclosure.

In Step S60, the to-be-etched path layer 50 and the first dielectric layer 221 are removed to form an air sidewall 71 in the sidewall structure 22, as shown in FIG. 8.

For example, the to-be-etched path layer 50 and the first dielectric layer 221 connected to the to-be-etched path layer 50 may be removed by means of wet etching, to form the air sidewall 71 in the sidewall structure 22. As an example, both the to-be-etched path layer 50 and the first dielectric layer 221 are silicon oxide layers, and the hard mask layer 125, the filling layer 60, the bit line dielectric layer 23 and the second dielectric layer 222 are all silicon nitride layers. The to-be-etched path layer 50 and the first dielectric layer 221 are removed in sequence by selecting an etchant for etching the silicon oxide layer, to form an air gap 72 and an air sidewall 71 communicated with the air gap 72. The peripheral region 12 is covered by the hard mask layer 125 and thus will not be damaged by the wet etching process.

In some embodiments, the to-be-etched path layer 50 and the first dielectric layer 221 may also be removed by means of dry etching. For example, the to-be-etched path layer 50 is etched by a gas with a higher etching rate to the silicon oxide layer taking advantage of etching selectivity difference between the silicon oxide layer and the silicon nitride layer. After the to-be-etched path layer 50 is removed, the gas is introduced through a path formed to continue etching the first dielectric layer 221, such that the air sidewall 71 is formed in the sidewall structure 22, as shown in FIG. 8.

With reference to FIG. 4 and the description of forming the to-be-etched path layer 50 in Step S30, it may be known that the to-be-etched path layer 50 is formed above the first dielectric layer 221 on two sides of the bit line 21 respectively. Therefore, after the to-be-etched path layer 50 and the first dielectric layer 221 are removed by means of an etching process, the air sidewall 71 may be formed on two sides of the bit line 21.

Figure 9:
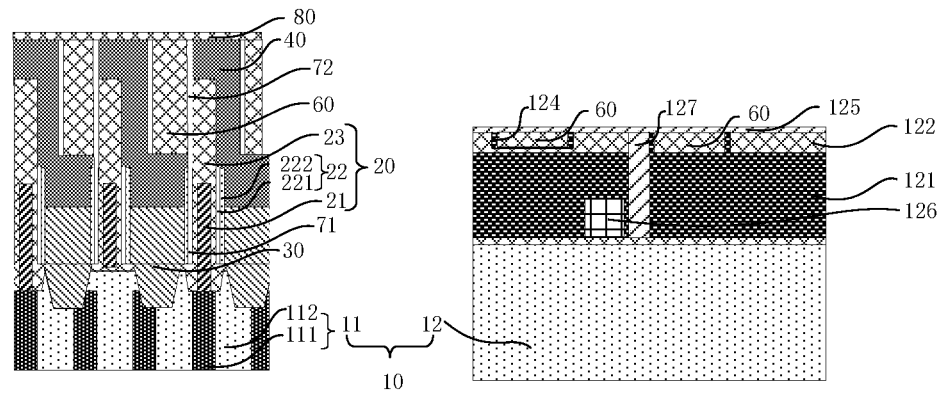
FIG. 9 is a schematic cross-sectional structural diagram showing the semiconductor structure after a sealing layer is formed thereon according to an embodiment of the present disclosure.

In Step S70, a sealing layer 80 is formed on the upper surface of the array region 11 to seal up an opening above the air sidewall 71, as shown in FIG. 9.

For example, a silicon nitride layer may be formed on the upper surface of the array region 11 by means of a plasma enhanced chemical vapor deposition (PECVD) process to serve as the sealing layer 80*dd* to seal up the opening above the air sidewall 71 and the air gap 72.

According to the above method for fabricating a semiconductor structure, after each of the plurality of pads 40 is formed, the to-be-etched path layer 50 connected to the first dielectric layer 221 is formed, such that the first dielectric layer 221 can be etched after a flat surface is formed on the array region 11 and the peripheral region 12, which is advantageous to forming the high-quality hard mask layer 125 on the surface of the peripheral region 12 and thus preventing the peripheral region 12 from being damaged during the etching of the first dielectric layer 221.

One embodiment of the present disclosure also discloses a semiconductor structure. As shown in FIG. 9, the semiconductor structure includes: a substrate 10 including an array region 11 and a peripheral region 12 connected to the array region 11, where the array region 11 is provided with bit line structures 20 arranged in parallel at intervals and multiple node contact structures 30 positioned between the bit line structures 20, and each of the bit line structures 20 includes a bit line 21 and a sidewall structure 22 positioned on two sides of the bit line 21, the sidewall structure 22 being provided with air sidewalls 71; a plurality of pads 40 positioned on the multiple node contact structures 30; an isolation structure positioned between adjacent two of the plurality of pads 40, where the isolation structure includes a filling layer 60 and air gaps 72 positioned on two opposite sides of the filling layer 60, one of the air gaps 72 being communicated with one of the air sidewalls 71; a hard mask layer 125 covering an upper surface of the peripheral region 12; and a sealing layer 80 covering an upper surface of the array region 11, the sealing layer 80 being configured to seal up an opening on a top of each of the air gaps 72.

In the above semiconductor structure, the surface of the peripheral region 12 is covered with the hard mask layer 125, which can provide a good protective effect on the electronic devices 126 in the peripheral region 12. The air sidewalls 71 are provided on two sides of the bit line 21, which can reduce the parasitic capacitance between the bit line 21 and each of the multiple node contact structures 30.

For example, as shown in FIG. 9, the array region 11 includes active regions 111 arranged in an array and shallow trench isolation (STI) structures 112 configured to separate the active regions 111. The array region 11 is provided with bit line structures 20 arranged in parallel at intervals, and each of the bit line structures 20 includes a first portion and a second portion, where the first portion is electrically connected to each of the active regions 111, and the second portion is positioned above each of the STI structures 112. Each of the multiple node contact structures 30 is positioned between adjacent two of the bit line structures 20 and is electrically connected to the active region 111 below the node contact structure 30. The sidewall structures 22 on two sides of the bit line 21 include the air sidewalls 71. Because a dielectric constant of air is much smaller than that of a low-K dielectric layer and the silicon nitride layer, the air sidewalls 71 are advantageous to reducing the parasitic capacitance between the bit line 21 and each of the multiple node contact structures 30.

For example, the bit line 21 includes a polysilicon layer, a barrier metal layer and a metal conductor layer stacked in sequence from bottom to top. In some other embodiments, the bit line 21 includes a metal conductor layer and a barrier metal layer wrapping a bottom surface and side surfaces of the metal conductor layer. The metal conductor layer may be a metal layer with lower resistivity, such as phosphorus (P) or arsenic (As) doped germanium (Ge), tungsten (W), copper (Cu) or gold (Au); and the barrier metal layer may be, for example, a titanium layer or titanium nitride layer. The sidewall structure 22 may be, for example, a silicon nitride layer, and the sidewall structure 22 has an air sidewall 71 therein. Each of the multiple node contact structures 30 is positioned between adjacent two of the bit line structures 20, penetrates through an upper surface of the array region 11, and is electrically connected to each of the active regions 111 positioned below the multiple node contact structures 30. The multiple node contact structures 30 may be material layers with better conductivity, such as polysilicon layers or metal layers.

As shown in FIG. 9, the plurality of pads 40 are positioned on the multiple node contact structures 30, and an isolation structure is provided between adjacent two of the plurality of pads 40. The isolation structure includes a filling layer 60 and air gaps 72 positioned on two sides of the filling layer 60, where the air gap 72 near each of the bit line structures 20 is communicated with the air sidewall 71 in the sidewall structure 22. The sealing layer 80 covers the upper surface of each of the plurality of pads 40 and seals up the opening at the top of the air gap 72.

For example, a material forming the plurality of pads 40 may include a metal having lower resistivity, such as copper. The filling layer 60 in the isolation structure may be a silicon nitride layer. The sealing layer 80 and the hard mask layer 125 may include, but are not limited to, a silicon nitride layer.

The hard mask layer 125 may be, for example, the silicon nitride layer, covering the upper surface of the peripheral region 12.

In some embodiments, with continued reference to FIG. 9, each of the bit line structures 20 also includes a bit line dielectric layer 23 positioned on the upper surface of the bit line 21, where the bit line dielectric layer 23 includes a first sidewall and a second sidewall; and each of the plurality of pads 40 covers the top surface and the first sidewall of the bit line dielectric layer 23. For example, the bit line dielectric layer 23 may be a silicon nitride layer. In some other embodiments, the bit line dielectric layer 23 may also cover the sidewalls of the bit line 21 to completely wrap around the bit line 21; and the sidewall structures 22 are positioned on two opposite sides of the bit line dielectric layer 23.

For example, the sidewall structure 22 includes a first sidewall structure and a second sidewall structure opposite to each other, where the first sidewall structure is close to the first sidewall of the bit line dielectric layer 23, and the second sidewall structure is close to the second sidewall of the bit line dielectric layer 23. The isolation structure is connected to the second sidewall of the bit line dielectric layer 23, and the air gap 72 in the isolation structure close to the second sidewall is communicated with the air sidewall 71 in the second sidewall structure.

In some embodiments, the top surface of the isolation structure is flush with the top surface of each of the plurality of pads 40; and the sealing layer 80 covers the top surface of the filling layer 60, the top surface of each of the plurality of pads 40 and the opening at the top of the air gap 72 to seal up the opening at the top of the air gap 72.

In some embodiments, the peripheral region 12 is provided with a dielectric layer and a protective layer 122 stacked in sequence from bottom to top. A groove is formed on the surface of the peripheral region 12, and the groove is positioned in the protective layer 122 or penetrates through the protective layer 122. The hard mask layer 125 fills up the groove and covers the surface of the protective layer 122. For example, the dielectric layer is provided with the electronic device 126 or other conductive structures such as the conductive plug 127. For example, the conductive plug 127 penetrates through the dielectric layer and the protective layer 122.

In some embodiments, the upper surface of the protective layer 122 has multiple metal electrode layers, which are electrically connected to the metal plugs 127. The groove is positioned between adjacent metal electrode layers. The hard mask layer 125 covers the metal electrode layers.

It is to be understood that although the steps in the flowchart of FIG. 1 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a part of the steps in FIG. 1 may include multiple steps or multiple stages. These steps or stages are not necessarily performed at the same moment, but may be executed at different moments, and the order of execution of these steps or stages is not necessarily performed sequentially, but may be performed alternately or alternately with at least a part of the steps or stages of other steps or other steps.

For example, the semiconductor structures fabricated using the method in the above embodiments may be applied to semiconductor devices having air sidewalls. As an example, by using the method in the above embodiments to fabricate the air sidewalls in the bit line structures and applying the method to the fabrication of DRAM devices, yield of the DRAM devices can be improved, and negative effects of the parasitic capacitance on the device performance can be reduced.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A method for fabricating a semiconductor structure comprising:

providing a substrate, the substrate comprising an array region and a peripheral region connected to the array region, the array region being provided with bit line structures arranged in parallel at intervals and multiple node contact structures positioned between the bit line structures, each of the bit line structures comprising a bit line and a sidewall structure formed on two opposite sides of the bit line, the sidewall structure comprising a first dielectric layer and a second dielectric layer formed on an outside of the first dielectric layer;

arranging a plurality of pads on the array region, the plurality of pads are formed between the bit line structures, the plurality of pads being formed on the multiple node contact structures in one-to-one correspondence, an isolation trench being formed between adjacent two of the plurality of pads, wherein a top surface of the first dielectric layer is exposed when the isolation trench is formed;

forming a to-be-etched path layer on a sidewall of the isolation trench, the to-be-etched path layer in the isolation trench being connected to the exposed first dielectric layer;

forming a filling layer filling up the isolation trench;

forming a hard mask layer covering an upper surface of the peripheral region and exposing an upper surface of the array region;

removing the to-be-etched path layer and the first dielectric layer to form an air sidewall in the sidewall structure; and forming a sealing layer on the upper surface of the array region to seal up an opening above the air sidewall.

2. The method for fabricating a semiconductor structure according to claim 1, wherein a groove is formed on a surface of the peripheral region while the isolation trench is etched to expose the top surface of the first dielectric layer.

3. The method for fabricating a semiconductor structure according to claim 1, wherein
each of the bit line structures further comprises a bit line dielectric layer positioned on an upper surface of the bit line, the bit line dielectric layer comprising a first sidewall and a second sidewall; forming a plurality of pads above the multiple node contact structures comprising:
forming a metal material layer above the array region, the metal material layer covering the bit line structures and the multiple node contact structures; and
etching the metal material layer to form a plurality of mutually independent pads; wherein the plurality of pads are connected to the multiple node contact structures and cover a top surface of the bit line dielectric layer and the first sidewall.

4. The method for fabricating a semiconductor structure according to claim 3, wherein
the sidewall structure comprises a first sidewall structure and a second sidewall structure respectively positioned on two opposite sides of the bit line, the first sidewall structure being close to the first sidewall, and the second sidewall structure being close to the second sidewall; the isolation trench being positioned between adjacent two of the plurality of pads and exposing the top surface of the first dielectric layer in the second sidewall structure.

5. The method for fabricating a semiconductor structure according to claim 2, wherein
the peripheral region is provided with a buffer layer and a protective layer stacked in sequence from bottom to top, the groove being positioned in the protective layer, or the groove penetrating through the protective layer to expose the buffer layer.

6. The method for fabricating a semiconductor structure according to claim 5, wherein
the forming a to-be-etched path layer on a sidewall of the isolation trench such that the to-be-etched path layer is connected to the exposed first dielectric layer further comprises:
forming a peripheral region dielectric layer on a sidewall of the groove, a top surface of the peripheral region dielectric layer being flush with an upper surface of the protective layer.

7. The method for fabricating a semiconductor structure according to claim 6, wherein the upper surface of the protective layer is provided with multiple electrode layers, the groove being positioned between adjacent two of the multiple electrode layers, and the top surface of the peripheral region dielectric layer being flush with an upper surface of each of the multiple electrode layers.

8. The method for fabricating a semiconductor structure according to claim 7, wherein
the forming a filling layer filling up the isolation trench and the groove comprises:
forming a filling material layer covering an upper surface of a structure obtained and filling up the isolation trench and the groove; and
removing the filling material layer on the upper surface of the structure obtained to form the filling layer, an upper surface of the filling layer being flush with a top surface of the to-be-etched path layer and the top surface of the peripheral region dielectric layer.

9. The method for fabricating a semiconductor structure according to claim 8, wherein the forming a hard mask layer covering an upper surface of the peripheral region and exposing an upper surface of the array region comprises:
forming a hard mask material layer on the substrate; and
removing the hard mask material layer on the upper surface of the array region to expose the top surface of the to-be-etched path layer, and retaining the hard mask material layer on the upper surface of the peripheral region to form the hard mask layer.

10. The method for fabricating a semiconductor structure according to claim 9, wherein the first dielectric layer, the buffer layer, the peripheral region dielectric layer and the to-be-etched path layer each comprise a silicon oxide layer; and the second dielectric layer, the filling layer and the hard mask layer each comprising a silicon nitride layer.

11. A semiconductor structure, comprising:
a substrate comprising an array region and a peripheral region connected to the array region, the array region comprising bit line structures arranged in parallel at intervals and multiple node contact structures positioned between the bit line structures, each of the bit line structures comprising a bit line and a sidewall structure positioned on two sides of the bit line, the sidewall structure being provided with air sidewalls; a plurality of pads positioned on the multiple node contact structures; an isolation structure positioned between adjacent two of the plurality of pads, the isolation structure comprising a filling layer and air gaps positioned on two opposite sides of the filling layer, one of the air gaps being communicated with one of the air sidewalls; a hard mask layer covering an upper surface of the peripheral region; and a sealing layer covering an upper surface of the array region, the sealing layer being configured to seal up an opening on a top of each of the air gaps.

12. The semiconductor structure according to claim 11, wherein each of the bit line structures further comprises a bit line dielectric layer positioned on an upper surface of the bit line, the bit line dielectric layer comprising a first sidewall and a second sidewall wall, and each of the plurality of pads covering a top surface and the first sidewall of the bit line dielectric layer.

13. The semiconductor structure according to claim 12, wherein the sidewall structure comprises a first sidewall structure and a second sidewall structure respectively positioned on two opposite sides of the bit line, the first sidewall structure being close to the first sidewall, and the second sidewall structure being close to the second sidewall; the isolation structure being connected to the second sidewall, and the air gap in the isolation structure getting close to the second sidewall being communicated with the air sidewall in the second sidewall structure.

14. The semiconductor structure according to claim 11, wherein a top surface of the isolation structure is flush with a top surface of each of the plurality of pads, the sealing layer covering a top surface of the filling layer, the top surface of each of the plurality of pads, and the opening at the top of each of the air gaps.

15. The semiconductor structure according to claim 11, wherein the peripheral region is provided with a dielectric layer and a protective layer stacked in sequence from bottom to top, a groove being formed on a surface of the peripheral region, the groove being positioned in the protective layer or penetrating through the protective layer, and the hard mask layer filling up the groove and covering a surface of the protective layer.

16. The semiconductor structure according to claim 15, wherein an upper surface of the protective layer is provided with multiple electrode layers, the hard mask layer covering the multiple electrode layers.

* * * * *